United States Patent
Liao et al.

(10) Patent No.: US 12,007,439 B1
(45) Date of Patent: Jun. 11, 2024

(54) METHOD AND APPARATUS FOR INTEGRATED CIRCUIT TESTING

(71) Applicant: Winbond Electronics Corp., Taichung (TW)

(72) Inventors: Kuo-Min Liao, Taichung (TW); Tien-Yu Liao, Taichung (TW); Chien-Han Liao, Taichung (TW)

(73) Assignee: Winbond Electronics Corp., Taichung (TW)

( * ) Notice: Subject to any disclaimer, the term of this patent is extended or adjusted under 35 U.S.C. 154(b) by 31 days.

(21) Appl. No.: 18/149,165

(22) Filed: Jan. 3, 2023

(51) Int. Cl.
  *G01R 31/3183* (2006.01)
  *G01R 31/3193* (2006.01)

(52) U.S. Cl.
  CPC .......... *G01R 31/318371* (2013.01); *G01R 31/31932* (2013.01); *G01R 31/31935* (2013.01)

(58) Field of Classification Search
  CPC ...... G01R 31/318371; G01R 31/31932; G01R 31/31935
  USPC ............... 714/724, 718, 719, 736, 737, 742
  See application file for complete search history.

(56) References Cited

U.S. PATENT DOCUMENTS

| | | | | |
|---|---|---|---|---|
| 6,061,815 A * | 5/2000 | Sobelman | ............. | G11C 29/56 714/743 |
| 6,532,556 B1 * | 3/2003 | Wong | .............. | G06F 12/1408 711/E12.092 |
| 6,564,346 B1 * | 5/2003 | Vollrath | ........... | G01R 31/31935 714/723 |
| 6,591,385 B1 * | 7/2003 | Krech, Jr. | ........ | G11C 29/56012 365/201 |
| 7,467,363 B2 * | 12/2008 | Price | ..................... | G11C 29/04 716/136 |
| 2007/0124628 A1 * | 5/2007 | Price | ................ | G11C 29/56008 714/718 |
| 2007/0143568 A1 * | 6/2007 | Gould | ................. | G06F 12/0646 711/E12.084 |

OTHER PUBLICATIONS

Kong et al., Qualitative and Quantitative Analysis of Multi-Pattern Wafer Bin Maps, Nov. 2020, IEEE, vol. 33, No. 4, pp. 578-586. (Year: 2020).*

* cited by examiner

Primary Examiner — John J Tabone, Jr.
(74) Attorney, Agent, or Firm — JCIPRNET (57) ABSTRACT

A method and an apparatus for integrated circuit testing are provided. The method includes: operating a tester to perform a qualitative testing on devices in the integrated circuit by following electrical addresses of the devices, and to introduce an original verification pattern during the qualitative testing, such that a verification pattern corresponding to the original verification pattern can be converted from a raw data of a result of the qualitative testing; converting the raw data to a test graph presented by physical addresses, by using pre-determined scramble equations; and identifying portions of the verification pattern appeared in the test graph and comparing the portions of the verification pattern with corresponding portions of the original verification pattern by pattern recognition, and correcting the pre-determined scramble equations according to comparison result.

18 Claims, 11 Drawing Sheets

FIG. 1

S202 — operating a tester to perform a qualitative testing on devices in an integrated circuit by following electrical addresses of the devices, and to introduce an original verification pattern during the qualitative testing, such that a verification pattern corresponding to the original verification pattern can be converted from a raw data of a result of the qualitative testing S204 — converting the raw data to a test graph presented by physical addresses, by using pre-determined scramble equations S206 — identifying portions of the verification pattern appeared in the test graph and comparing the portions of the verification pattern with corresponding portions of the original verification pattern by pattern recognition, and correcting the pre-determined scramble equations according to comparison result

Legend (42):

| |
|---|
| EX0=PX0 |
| EX1=PX1 |
| EX2=PX2 |
| EX3=PX3 |
| EY0=PY0 |
| EY1=PY1 |

Table 44 — floor plan:

| floor plan | | PY0 | 0 | 1 | 0 | 1 |
|---|---|---|---|---|---|---|
| | | EY1 | 0 | 0 | 1 | 1 |
| PY1 | EX0/EY0 | | | | | |
| 0 | 1 | 17 | 33 | 49 | | |
| 0 | 0 | 16 | 32 | 48 | | |
| 1 | 0 | | | | | |
| 1 | 1 | | | | | |

| PX3 | PX2 | PX1 | PX0 | EX3 | EX2 | EX1 | EX0/EY0 | values → |
|---|---|---|---|---|---|---|---|---|
| 0 | 0 | 0 | 0 | 0 | 0 | 0 | 1 | 17, 33, 49 |
| 0 | 0 | 0 | 0 | 0 | 0 | 0 | 0 | 16, 32, 48 |
| 0 | 0 | 0 | 1 | 0 | 0 | 1 | 1 | 3, 19, 35, 51 |
| 0 | 0 | 0 | 1 | 0 | 0 | 1 | 0 | 2, 18, 34, 50 |
| 0 | 0 | 1 | 0 | 0 | 1 | 0 | 1 | 5, 21, 37, 53 |
| 0 | 0 | 1 | 0 | 0 | 1 | 0 | 0 | 4, 20, 36, 52 |
| 0 | 0 | 1 | 1 | 0 | 1 | 1 | 1 | 7, 23, 39, 55 |
| 0 | 0 | 1 | 1 | 0 | 1 | 1 | 0 | 6, 22, 38, 54 |
| 0 | 1 | 0 | 0 | 1 | 0 | 0 | 1 | 9, 25, 41, 57 |
| 0 | 1 | 0 | 0 | 1 | 0 | 0 | 0 | 8, 24, 40, 56 |
| 0 | 1 | 0 | 1 | 1 | 0 | 1 | 1 | 11, 27, 43, 59 |
| 0 | 1 | 0 | 1 | 1 | 0 | 1 | 0 | 10, 26, 42, 58 |
| 0 | 1 | 1 | 0 | 1 | 1 | 0 | 1 | 13, 29, 45, 61 |
| 0 | 1 | 1 | 0 | 1 | 1 | 0 | 0 | 12, 28, 44, 60 |
| 0 | 1 | 1 | 1 | 1 | 1 | 1 | 1 | 15, 31, 47, 63 |
| 0 | 1 | 1 | 1 | 1 | 1 | 1 | 0 | 14, 30, 46, 62 |

Legend (42a):
- EX0 = PX0^PX1
- EX1 = PX1
- EX2 = PX2
- EX3 = PX3
- EY0 = PY0
- EY1 = PY1

Floor plan (44a):

| | | PX3 | 0 | 0 | 0 | 0 | 0 | 0 | 0 | 0 | 1 | 1 | 1 | 1 | 1 | 1 | 1 | 1 |
|---|---|---|---|---|---|---|---|---|---|---|---|---|---|---|---|---|---|---|
| | | PX2 | 0 | 0 | 0 | 0 | 1 | 1 | 1 | 1 | 0 | 0 | 0 | 0 | 1 | 1 | 1 | 1 |
| | | PX1 | 0 | 0 | 1 | 1 | 0 | 0 | 1 | 1 | 0 | 0 | 1 | 1 | 0 | 0 | 1 | 1 |
| | | PX0 | 0 | 1 | 0 | 1 | 0 | 1 | 0 | 1 | 0 | 1 | 0 | 1 | 0 | 1 | 0 | 1 |
| | | EX3 | 0 | 0 | 0 | 0 | 0 | 0 | 0 | 0 | 1 | 1 | 1 | 1 | 1 | 1 | 1 | 1 |
| | | EX2 | 0 | 0 | 0 | 0 | 1 | 1 | 1 | 1 | 0 | 0 | 0 | 0 | 1 | 1 | 1 | 1 |
| | | EX1 | 0 | 0 | 1 | 1 | 0 | 0 | 1 | 1 | 0 | 0 | 1 | 1 | 0 | 0 | 1 | 1 |
| PY1 | PY0 | EY1 EX0/EY0 | 0 | 1 | 1 | 0 | 0 | 1 | 1 | 0 | 0 | 1 | 1 | 0 | 0 | 1 | 1 | 0 |
| 0 | 0 | 0 | 0 | 1 | 2 | 3 | 4 | 5 | 6 | 7 | 8 | 9 | 10 | 11 | 12 | 13 | 14 | 15 |
| 0 | 1 | 1 | 16 | 17 | 18 | 19 | 20 | 21 | 22 | 23 | 24 | 25 | 26 | 27 | 28 | 29 | 30 | 31 |
| 1 | 0 | 0 | 32 | 33 | 34 | 35 | 36 | 37 | 38 | 39 | 40 | 41 | 42 | 43 | 44 | 45 | 46 | 47 |
| 1 | 1 | 1 | 48 | 49 | 50 | 51 | 52 | 53 | 54 | 55 | 56 | 57 | 58 | 59 | 60 | 61 | 62 | 63 |

Floor plan table (66):

| floor plan | PY1 | | | | PY0 | | | | | | | | | | | | |
|---|---|---|---|---|---|---|---|---|---|---|---|---|---|---|---|---|---|
| | 0 | | | | 1 | | | | | | | 0 | | | | | |
| | EY1 | | | | 0 | | | | 1 | | | | 0 | | | | 1 |
| | EX0/EY0 | 1 | 0 | 1 | 0 | 1 | 0 | 1 | 0 | 1 | 0 | 1 | 0 | 1 | 0 | 1 | 0 |
| PX3 | | | | | | | | | | | | | | | | | |
| PX2 | | | | | | | | | | | | | | | | | |
| PX1 | | | | | | | | | | | | | | | | | |
| PX0 | | | | | | | | | | | | | | | | | |
| EX3 | | | | | | | | | | | | | | | | | |
| EX2 | | | | | | | | | | | | | | | | | |
| EX1 | | | | | | | | | | | | | | | | | |

Data grid (values 0–63 arranged in rows of 16):

| 17 | 16 | 19 | 18 | 21 | 20 | 23 | 22 | 25 | 24 | 27 | 26 | 29 | 28 | 31 | 30 |
| 1  | 0  | 3  | 2  | 5  | 4  | 7  | 6  | 9  | 8  | 11 | 10 | 13 | 12 | 15 | 14 |
| 33 | 32 | 35 | 34 | 37 | 36 | 39 | 38 | 41 | 40 | 43 | 42 | 45 | 44 | 47 | 46 |
| 49 | 48 | 51 | 50 | 53 | 52 | 55 | 54 | 57 | 56 | 59 | 58 | 61 | 60 | 63 | 62 |

METHOD AND APPARATUS FOR INTEGRATED CIRCUIT TESTING

BACKGROUND

Technical Field

Embodiments of the present disclosure relate to a testing method and a testing apparatus, and particularly, to a testing method and a testing apparatus for an integrated circuit.

Description of Related Art

As more devices are integrated in an integrated circuit, dimension and spacing of devices in circuit layout are reduced. Consequently, manufacturing process becomes more challenging, and defects may be more likely to be found in products. Therefore, testing each chip at wafer level is needed before moving on to packaging and further testing, so as to identify defected chip(s) at wafer level, and to modify manufacturing process according to the test result.

In general, qualitative testing is performed on devices in integrated circuit by following electrical addresses of the devices, and each device would be determined as either functional or failed. As being designed differently, different products may have different electrical addresses for devices. Consequently, the test data with electrical addresses has to be converted to test graph presented by physical addresses, such that identification for failure mode analysis can be realized.

The afore-mentioned conversion is mainly performed by using scramble equations. As having different design, different products have different electrical addresses for devices and may be suitable for different scramble equations. If unfitted scramble equations are used for conversion, distorted test graphs may be resulted. Therefore, at a development stage of a new product, identifying and correcting unfitted scramble equations by analyzing test graphs are required, and are executed manually, thus are time-consuming and susceptible to errors.

SUMMARY

An integrated circuit testing method and an integrated circuit testing apparatus are provided, for accurately identifying incorrect scramble equations by using pattern recognition, so as to shorten product verification process, and to lower cost for developing a new product.

In an aspect of the present disclosure, a testing method for an integrated circuit is provided. The method is suitable for an electronic apparatus having a processor. The method comprises: operating a tester to perform a qualitative testing on devices in the integrated circuit by following electrical addresses of the devices, and to introduce an original verification pattern during the qualitative testing, such that a verification pattern corresponding to the original verification pattern can be converted from a raw data of a result of the qualitative testing; converting the raw data to a test graph presented by physical addresses, by using pre-determined scramble equations; and identifying portions of the verification pattern appeared in the test graph and comparing the portions of the verification pattern with corresponding portions of the original verification pattern by pattern recognition, and correcting the pre-determined scramble equations according to comparison result.

In another aspect of the present disclosure, a testing apparatus for an integrated circuit is provided. The apparatus comprises: connecting apparatus, connected to a tester for testing the integrated circuit; a storage apparatus, configured to store application programs and scramble equations; and a processor, coupled to the connecting apparatus and the storage apparatus, and configured to load and execute the application programs, to: use the tester to perform a qualitative testing on devices in the integrated circuit by following electrical addresses of the devices, and to introduce an original verification pattern in the qualitative testing, such that a verification pattern corresponding to the original verification pattern can be converted from a raw data of a result of the qualitative testing; convert the raw data to a test graph presented by physical addresses, by using pre-determined scramble equations; and identify portions of the verification pattern appeared in the test graph and compare the portions of the verification pattern with corresponding portions of the original verification pattern by pattern recognition, and correct the pre-determined scramble equations according to comparison result.

The testing method and the testing apparatus introduce an original verification pattern (designed based on product properties) during a qualitative testing performed on an integrated circuit, and automatically detect and correct unfitted scramble equations by using pattern recognition and pattern comparison, then upload the corrected scramble equations to a view system. Therefore, incorrect scramble equations can be accurately identified, thus product verification process can be shortened, and cost for developing a new product can be lowered.

To make the aforementioned more comprehensible, several embodiments accompanied with drawings are described in detail as follows.

DESCRIPTION OF THE EMBODIMENTS

Figure 1:
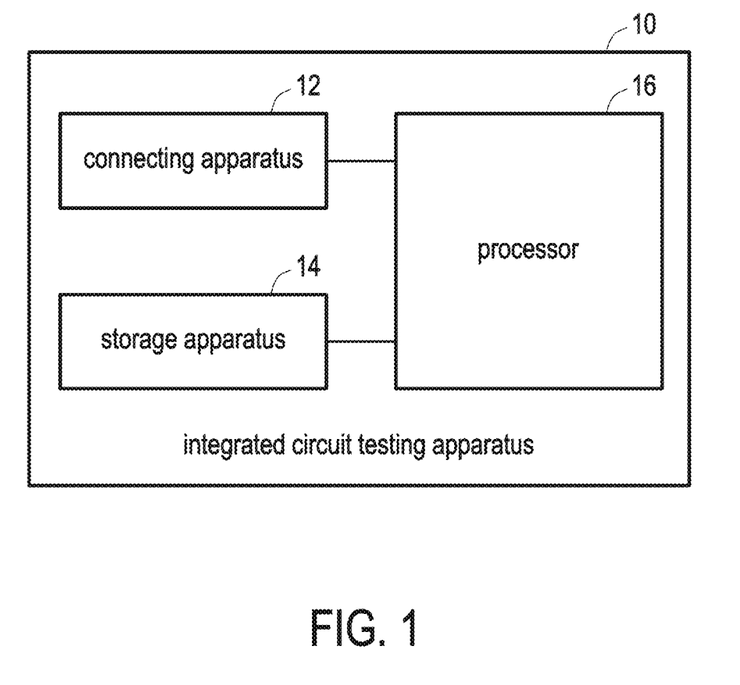
FIG. 1 is a block diagram illustrating an integrated circuit testing apparatus according to some embodiments of the present disclosure.

FIG. 1 is a block diagram illustrating an integrated circuit testing apparatus according to some embodiments of the present disclosure. Referring to FIG. 1, an integrated circuit testing apparatus 10 according to some embodiments is a computing electronic apparatus, such as a file server, a database server, an application server, a workstation or a personal computer. In some embodiments, the integrated circuit testing apparatus 10 is connected to a tester through a connecting apparatus 12. In other embodiments, the tester can be integrated in the integrated circuit testing apparatus 10. The tester is used for performing a qualitative testing on an integrated circuit, and is not limited to be external to the integrated circuit testing apparatus 10 or integrated in the integrated circuit testing apparatus 10. The integrated circuit testing apparatus 10 includes the connecting apparatus 12, a storage apparatus 14 and a processor 16, as will be described in further details regarding respective function.

The connecting apparatus 12 is such as a wired or wireless interface apparatus for establishing connection with an external apparatus (e.g., the tester), and for transmitting data to/from the external apparatus. As a wired type, the connecting apparatus 12 may be (but not limited to) a universal serial bus (USB), a RS232, a universal asynchronous receiver/transmitter (UART), an inter-integrated circuit (I2C) or a serial peripheral interface bus (SPI). As a wireless type, the connecting apparatus 12 may be (but not limited to) a device with communication protocol such as wireless-fidelity (Wi-Fi), radio frequency identification (RFID), Bluetooth, infrared radiation, near-field communication (NFC) or device-to-device (D2D) communication. In some embodiments, the connecting apparatus 12 can access the Internet via a wired or wireless manner, and can establish access to an external apparatus for data transmission. As examples, the connecting apparatus 12 may be a network interface controller compatible with wired network connection (e.g., Ethernet), or a wireless network interface controller compatible with wireless communication protocol (e.g., IEEE 802.11n/b/g).

The storage apparatus 14 is a recording medium of any non-portable or portable type, such as a random access memory (RAM), a read-only memory (ROM), a flash memory or a hard disk. Application programs executed by the processor 16 and data fetched via the connecting apparatus 12 can be stored in the storage apparatus 14. In some embodiments, the storage apparatus 14 can store (but not limited to) scramble equations to be used for converting raw data obtained by performing testing as following electrical addresses, to a test graph presented by physical addresses.

The processor 16 is such as a central processing unit, or can be any one or any combination of a programmable micro-processor for general applications or specific applications, a micro-controller, a digital signal processor, a programmable controller, an application specific integrated circuit, a programmable logic apparatus and the like. The present disclosure is not limited to types of the processor 16. In some embodiments, the processor 16 can load application programs from the storage apparatus 14, to execute an integrated circuit testing method according to embodiments of the present disclosure.

Figure 2:
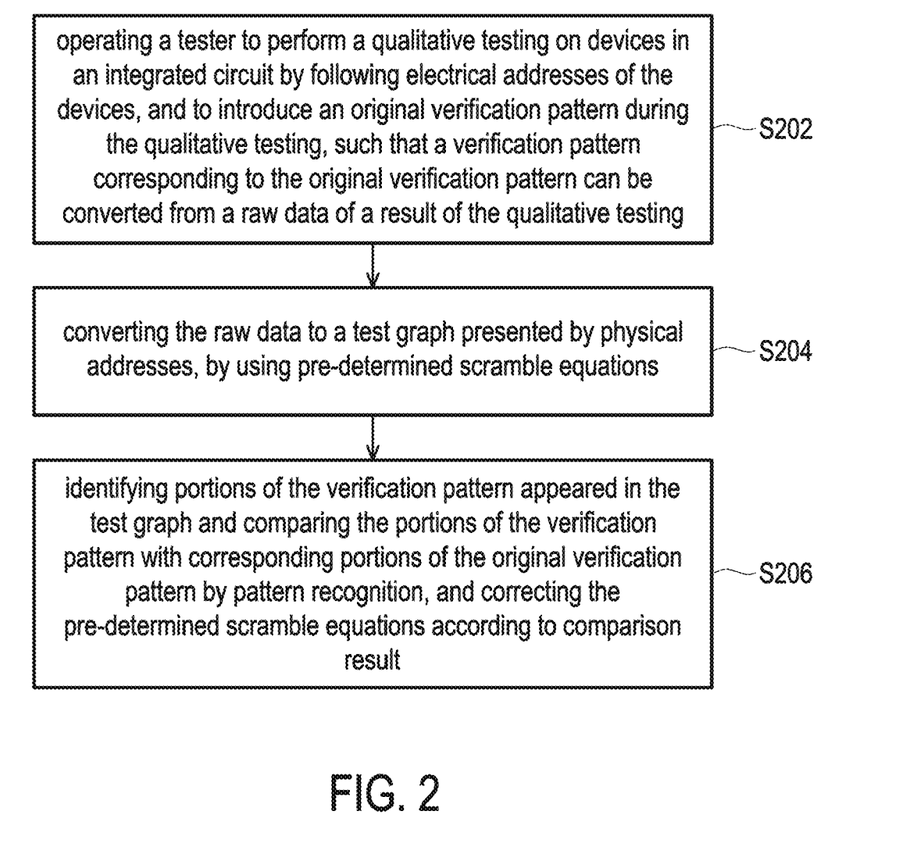
FIG. 2 is a flow diagram illustrating an integrated circuit testing method according to some embodiments of the present disclosure.

Specifically, FIG. 2 is a flow diagram illustrating an integrated circuit testing method according to some embodiments of the present disclosure. Referring to both of FIG. 1 and FIG. 2, the method can be operated by the integrated circuit testing apparatus 10 as shown in FIG. 1, and detailed steps of the method will be described with reference to various components in the integrated circuit testing apparatus 10.

At a step S202, the processor 16 in the integrated circuit testing apparatus 10 is connected to a tester by using the connecting apparatus 12, in order to use the tester for performing a qualitative testing on devices in an integrated circuit by following electrical addresses of the devices. A verification pattern is planted in the test result that the verification pattern can be converted from a raw data of the test result. Specifically, the verification pattern is such as a pattern designed according to properties of multiple tiles in the integrated circuit, and is such as (but not limited to) a circular pattern or an asymmetry pattern.

Figure 3:
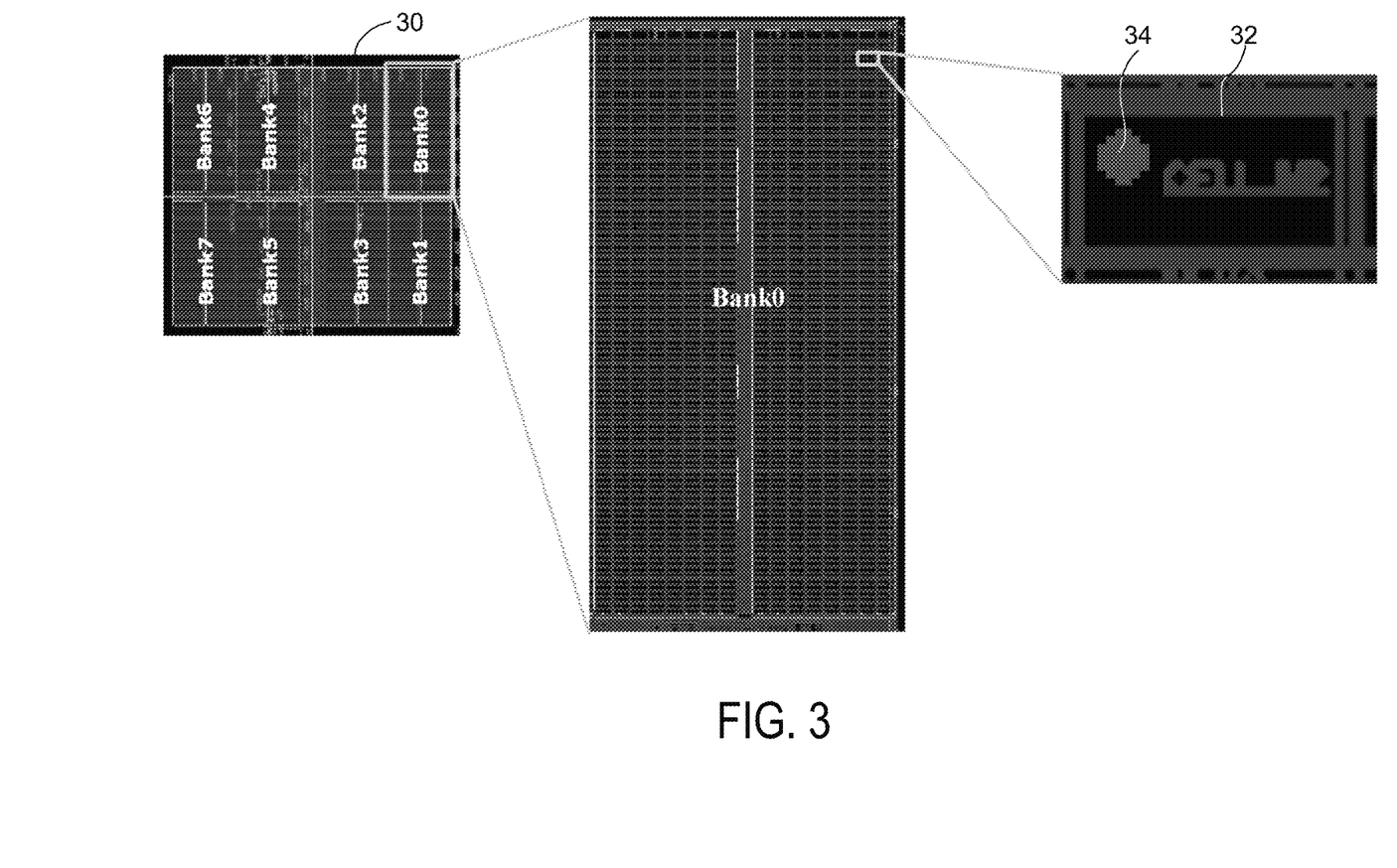
FIG. 3 illustrates an example of an integrated circuit layout, according to some embodiments of the present disclosure.

To be more specific, FIG. 3 illustrates an example of an integrated circuit layout, according to some embodiments of the present disclosure. Referring to FIG. 3, an integrated circuit 30 is such as a portion of a system-on-chip (SoC), and includes banks Bank0 through Bank7. Each bank includes multiple tiles. As an example, the bank Bank0 includes a tile 32. In some embodiments, the bank is a memory bank, and the tile is a memory array tile (MAT). Each memory array tile is such as a fully functional memory array, and includes (but not limited to) word lines, bit lines and sense amplifiers. According to embodiments of the present disclosure, the verification pattern is designed in accordance to tile dimensions, device distribution and device properties in the integrated circuit 30 to be tested. For instance, a circular verification pattern 34 (positioned at an upper left corner of the tile 32) is designed for the tile 32. During testing, all of the devices within the verification pattern 34 are determined as failed, so as to test if scramble equations used for converting electrical addresses of the tile 32 to physical addresses are correct. In other embodiments, the verification pattern may cover the entire tile, or may be a step pattern covering a certain portion of the tile. The present disclosure is not limited to size or shape of the verification pattern.

At a step S204, the processor 16 uses pre-determined scramble equations to convert the raw data to a test graph presented by physical addresses. The scramble equations include (but not limited to) an equation for invert conversion and an equation for mirror conversion. In some embodiments, the processor 16 uploads the raw data to a view system named "BitView", and converts the raw data recorded by text to the test graph presented by an image.

Figure 4A:
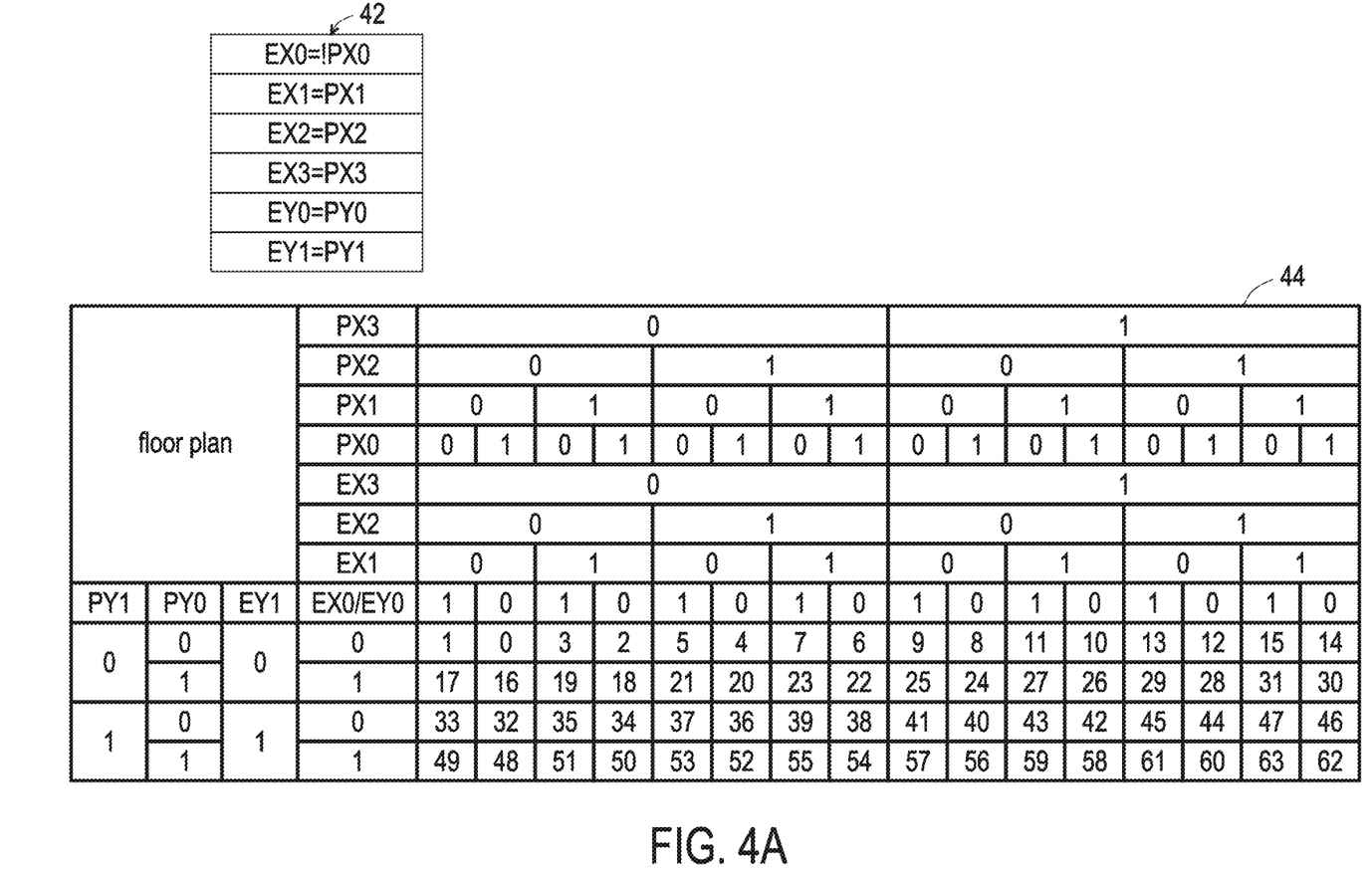
FIG. 4A and FIG. 4B illustrate an example of converting electrical addresses to physical addresses, according to some embodiments of the present disclosure.

FIG. 4A and FIG. 4B illustrate an example of converting electrical addresses to physical addresses, according to some embodiments of the present disclosure. FIG. 4A includes scramble equations 42 and a conversion table 44 showing conversion between the electrical addresses and the physical addresses by using the scramble equations 42. Referring to FIG. 4A, EX0 through EX3 are sequenced by a device testing order following device electrical addresses along an X direction (e.g., a bit line direction) in the integrated circuit, and include bits from a least significant bit (LSB) EX0 to a most significant bit (MSB) EX3. On the other hand, PX0 through PX3 are sequenced by a device testing order following device physical addresses along the X direction in the integrated circuit, and includes bits from a LSB PX0 to a MSB PX3. Further, EY0 and EY1 are sequenced by a device testing order following device electrical addresses along a Y direction (e.g., a word line direction) in the integrated circuit, and PY0 and PY1 are sequenced by a device testing order following device physical addresses along the Y direction in the integrated circuit. Among combinations, the bit EX0 and the bit PX0 are inverted with respect to each other. Therefore, a scramble equation for the bits EX0, PX0 would be EX0=!PX0. In addition, the bit EX1 and the bit PX1 are identical with each other, and a corresponding scramble equation would be: EX1=PX1. Similarly, the bit EX2 and the bit PX2 are identical with each other, and a corresponding scramble equation would be: EX2=PX2. In this way, the scramble equations 42 for converting the electrical addresses to physical addresses (and vice versa) can be obtained.

Figure 4B:
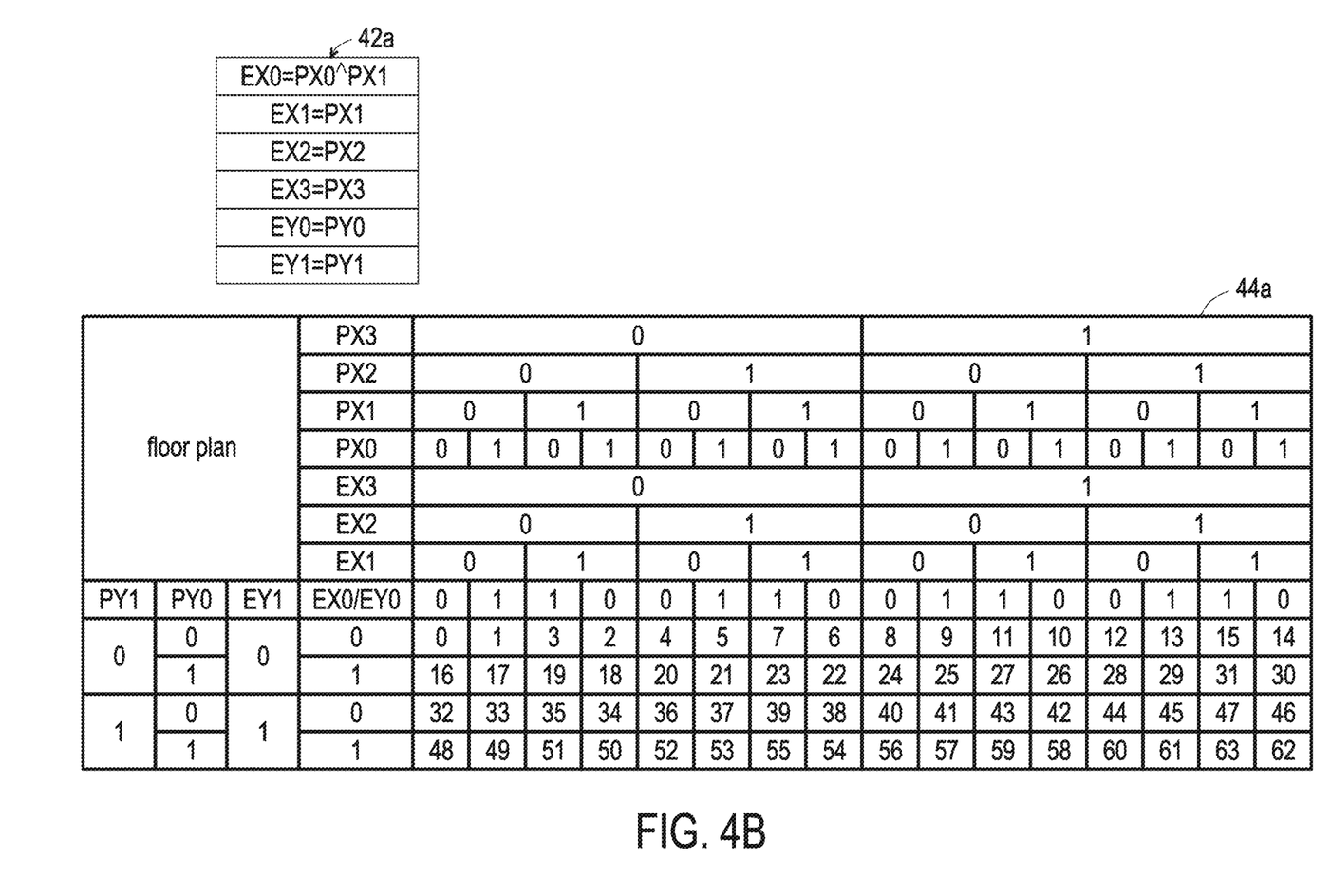

As similar to FIG. 4A, FIG. 4B includes scramble equations 42a and a conversion table 44a showing conversion between the electrical addresses and the physical addresses by using the scramble equations 42a. Referring to FIG. 4B, EX0 through EX3 are sequenced by a device testing order following device electrical addresses along the X direction in the integrated circuit, and include bits from a LSB EX0 to a MSB EX3. On the other hand, PX0 through PX3 are sequenced by a device testing order following device physical addresses along the X direction in the integrated circuit, and includes bits from a LSB PX0 to a MSB PX3. Further, EY0 and EY1 are sequenced by a device testing order following device electrical addresses along a Y direction (e.g., a word line direction) in the integrated circuit, and PY0 and PY1 are sequenced by a device testing order following device physical addresses along the Y direction in the integrated circuit. Among combinations, the bit EX0 and the bit PX0 are in mirror with respect to each other, and a corresponding scramble equation would be: EX0=PX0^PX1, where "^" stands for an XOR logic operation. In addition, the bit EX1 and the bit PX1 are identical with each other, and a corresponding scramble equation would be: EX1=PX1. Similarly, the bit EX2 and the bit PX2 are identical with each other, and a corresponding scramble equation would be: EX2=PX2. In this way, the scramble equations 42a for converting the electrical addresses to physical addresses (and vice versa) can be obtained. Although the mirror conversion involves 4 bits in the present embodiments, the mirror conversion may involve 2 bits, 8 bits or other number of bits, the present disclosure is not limited to how many bits are involved in the mirror conversion.

At a step S206, the processor 16 identifies portions of the verification pattern in the test graph by pattern recognition, and compare those portions of the verification pattern in the test graph with corresponding portions of an originally determined verification pattern, to correct the scramble equations according to comparison result. Specifically, the processor 16 identifies boundary and position of those portions of the verification pattern in the test graph by pattern recognition, and compare the boundary and position of those portions of the verification pattern in the test graph with boundary and position of corresponding portions in the originally determined verification pattern, to determine if the scramble equations are fitted. If not, the processor 16 further analyzes boundary and position of each portion of the verification pattern in the test graph, to select suitable scramble equations for converting raw data, such that the verification pattern in the test graph obtained by using the updated scramble equations can match the originally determined verification pattern. In some embodiments, the processor 16 uploads the updated scramble equations to the view system "BitView", to enable examination on the subsequently output test graph. Therefore, correct test graph can be ensured.

In this way, the method according to embodiments of the present disclosure can examine and correct scramble equations at a development stage of a new product, thus are helpful for identification in subsequent failure mode analysis and physical failure analysis (PFA).

In some embodiments, the processor 16 can perform in-tile and/or between-tiles scramble equation correction on MATs in the integrated circuit. Further, during the scramble equation correction, an order from MSB to LSB (according to electrical addresses) may be followed, to sequentially examine and correct scramble equations, and to perform scramble conversion for obtaining the test graph, so as to ensure that the most fitted scramble equations are used.

Figure 5:
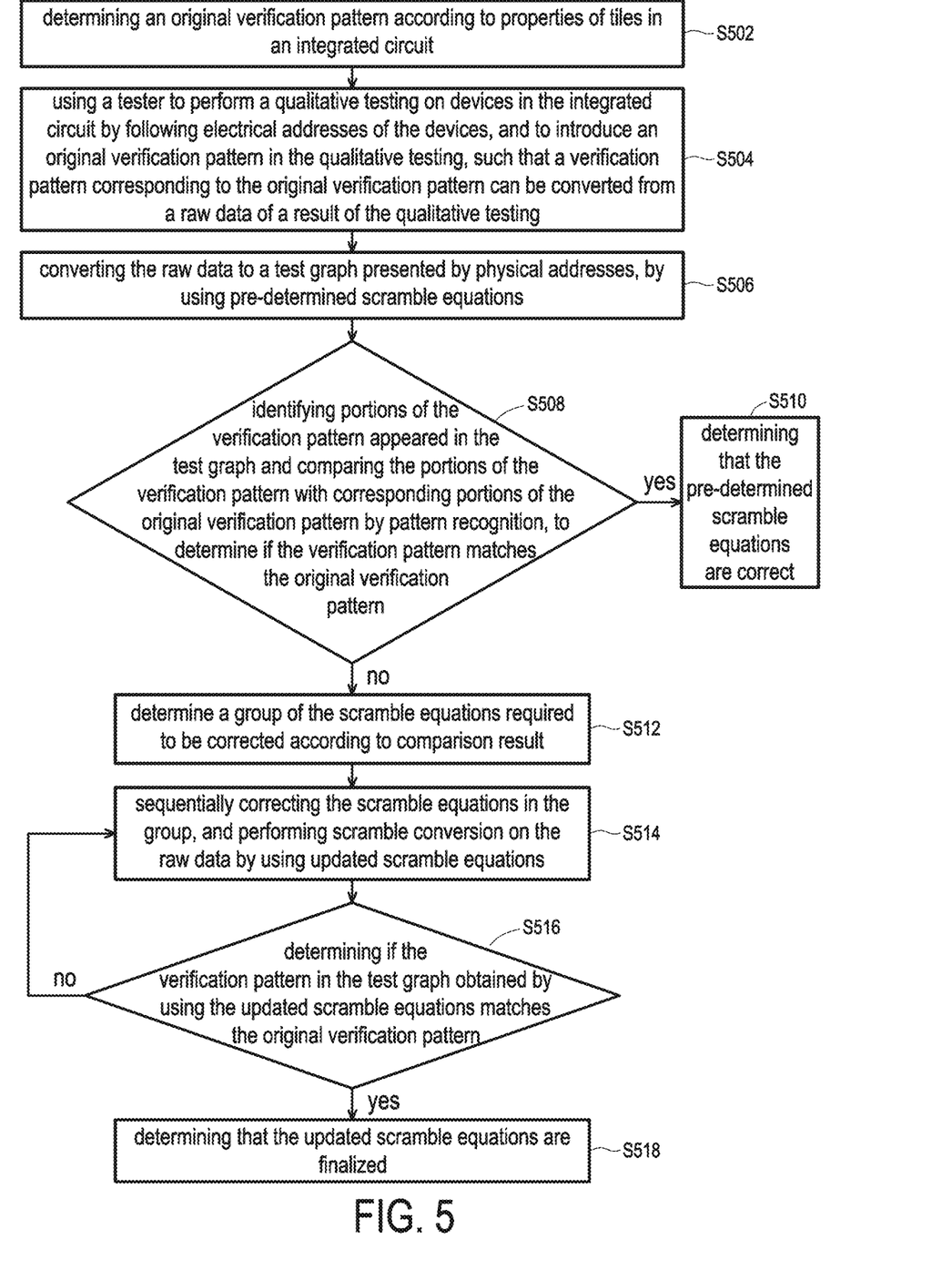
FIG. 5 is a flow diagram illustrating an integrated circuit testing method, according to some embodiments of the present disclosure.

FIG. 5 is a flow diagram illustrating an integrated circuit testing method, according to some embodiments of the present disclosure. Referring to both of FIG. 1 and FIG. 5, the method according to these embodiments is applicable to the integrated circuit testing apparatus 10 as shown in FIG. 1. Detailed steps of the method according to these embodiments will be described with reference to the components in the integrated circuit testing apparatus 10.

At a step S502, the processor 16 in the integrated circuit testing apparatus 10 determines a verification pattern according to properties of tiles in an integrated circuit. This verification pattern is such as a circular pattern, or an asymmetric pattern such as a step pattern covering a certain portion of the tiles or entirely covering the tiles. The present disclosure is not limited to size or shape of the verification pattern.

At a step S504, the processor 16 is connected to a tester by using the connecting apparatus 12, in order to use the tester for performing a qualitative testing on devices in the integrated circuit by following electrical addresses of the devices. The verification pattern is introduced into the qualitative testing, such that a verification pattern can be converted from a raw data of the test result. At a step S506, the processor 16 uses pre-determined scramble equations to convert the raw data to a test graph presented by physical addresses. The steps S504 to S506 are identical or similar to the steps S202 to S204 according to afore-described embodiments, thus will not be described in further details.

As a difference from the afore-described embodiments, in a step S508 according to the present embodiments, the processor 16 identifies boundary and position of each portion of the verification pattern in the test graph within each tile by pattern recognition, and compare the boundary and position of each portion of the verification pattern in the test graph with boundary and position of corresponding portion of the originally determined verification pattern, to determine if the verification pattern in the test graph matches the originally determined verification pattern. In some embodiments, the processor 16 identifies portions of the verification pattern in the test graph within each tile, and compare these portions of the verification pattern in the test graph within each tile with corresponding portions of the originally determined verification pattern, to correct the scramble equations for each tile according to comparison result. In other embodiments, the processor 16 can further correct scramble equations for between-tile regions according to the corrected scramble equations for each tile.

In the step S508, if the boundary and positon of each portion of the identified verification pattern match boundary and position of corresponding portion of the originally determined verification pattern, then the method moves on to a step S510, at which the processor 16 determines that the scramble equations are fitted.

On the other hand, if the boundary and positon of some portions of the identified verification pattern do not match boundary and position of corresponding portions of the originally determined verification pattern, then the method moves on to a step S512, at which the processor 16 determines a range of the scramble equations required to be corrected, according to the comparison result. In some embodiments, the processor 16 may assess difference between the portions of the verification pattern in the test graph and corresponding portions of the originally determined verification pattern, and determine if the difference for each of these portions is greater than a predetermined threshold value. Based on the magnitude of the difference, the processor 16 determines if scramble equations for these portions of the verification pattern in the test graph should be re-determined. As each and every portion of the identified verification pattern is examined, a range of the scramble equations required to be corrected can be decided.

In a step S514, the processor 16 sequentially changes the scramble equations, and performs scramble conversion by using the updated scramble equations, for obtaining a corrected test graph. In some embodiments, the processor 16 changes the scramble equations by following an order from MSB to LSB (presented by electrical addresses), as MSB has the greatest impact. In addition, the processor 16 performs scramble conversion based on the updated scramble equations, for obtaining a corrected test graph. In other embodiments, the order from MSB to LSB (presented by electrical addresses) is also followed, but the processor 16 selects one of the scramble equations for changing, by comparing difference between portions of the verification pattern in the test graph and corresponding portions of the originally determined verification pattern. Subsequently, the processor 16 changes other scramble equations by following the order, to obtain all updated scramble equations. Therefore, the processor 16 is not limited to changing a single one of the scramble equations, but changing one of the scramble equations that is determined to have the greatest impact by comparing difference between portions of the verification pattern in the test graph and corresponding portions of the originally determined verification pattern, then chooses other scramble equations for changing, such that the verification pattern of the test graph obtained by using the updated scramble equations can be as close to the originally determined verification pattern as possible.

At a step S516, the processor 16 determines if the verification pattern in the test graph obtained by using the updated scramble equations matches the originally determined verification data. If not, the method goes back to the step S514, at which the processor 16 sequentially changes the scramble equations, and performs scramble conversion by using the latest scramble equations, for obtaining a further corrected test graph. On the other hand, if the two match with each other, then the method moves on to a step S518, at which the processor 16 determines that the current scramble equations are finalized.

Therefore, the method according to embodiments of the present disclosure can provide proper correction to scramble equations for in-tile and between-tiles regions in an integrated circuit, such that verification of a new product can be shortened, thus cost for developing a new product can be lowered.

Figure 6A:
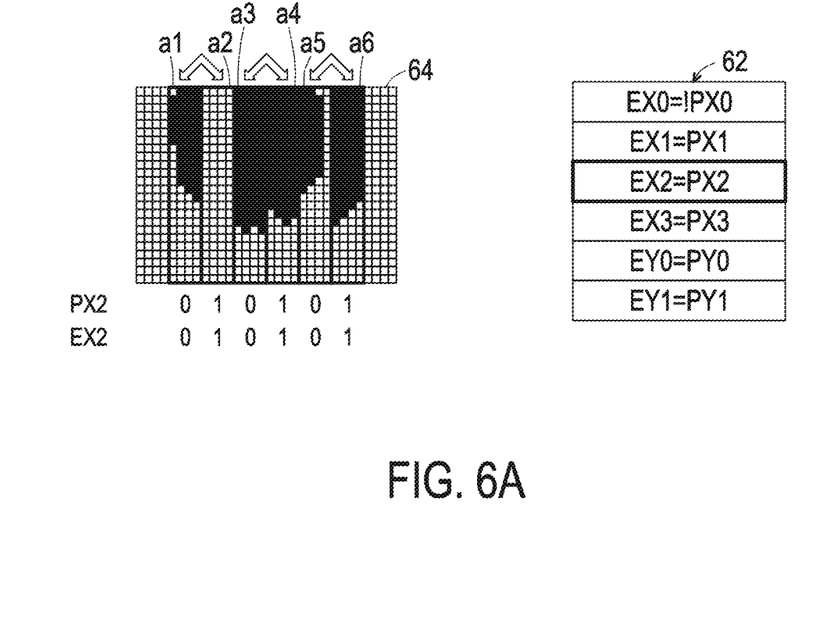
FIG. 6A through FIG. 6D illustrate an example of correcting scramble equations, according to some embodiments of the present disclosure.
Figure 6B:
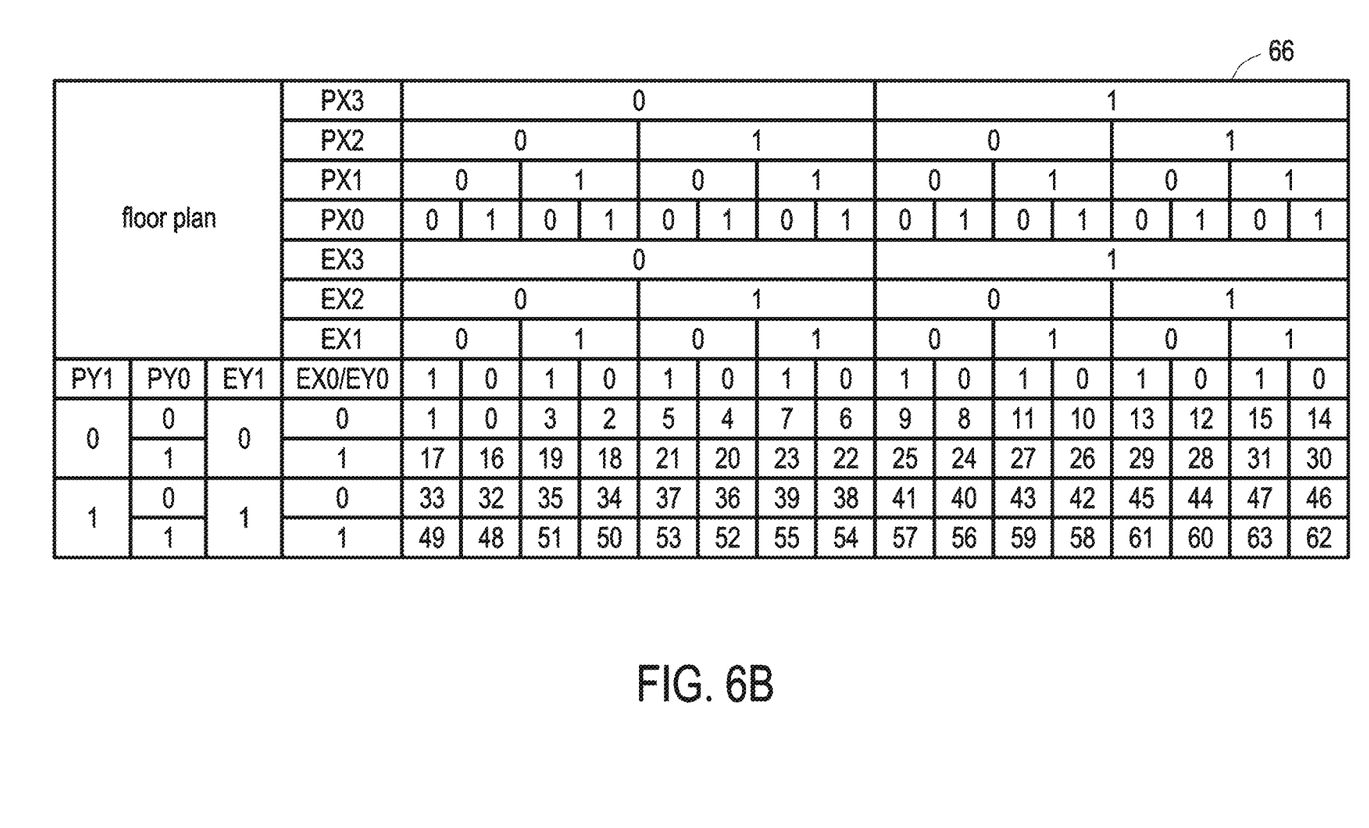

FIG. 6A through FIG. 6D illustrate an example of correcting scramble equations, according to some embodiments of the present disclosure. FIG. 6A includes pre-determined scramble equations 62, and includes a test graph 64 obtained by using the pre-determined scramble equations 62 to convert raw data to physical addresses. FIG. 6B includes a conversion table 66 showing conversion between electrical addresses and physical addresses corresponding to the pre-determined scramble equations 62. By comparing boundary and position of portions of a verification pattern in the test graph 64 (e.g., a dark region in the test graph 64) with boundary and position of corresponding portions of an originally determined verification pattern (e.g., a circular pattern), the verification pattern in the test graph obtained by using the pre-determined scramble equations 62 is determined as inconsistent with the originally determined verification pattern. In this case, portions of the test graph required to be corrected (e.g., portions a1-a6 within a width of four devices) and corresponding ones of the scramble equations are determined. As an example, the bit EX2 presented by an electrical address can be converted to the bit PX2 presented by a physical address as using an inversion scramble equation, such that the verification in the test graph obtained by using the inversion scramble equation matches the originally determined verification pattern.

Figure 6C:
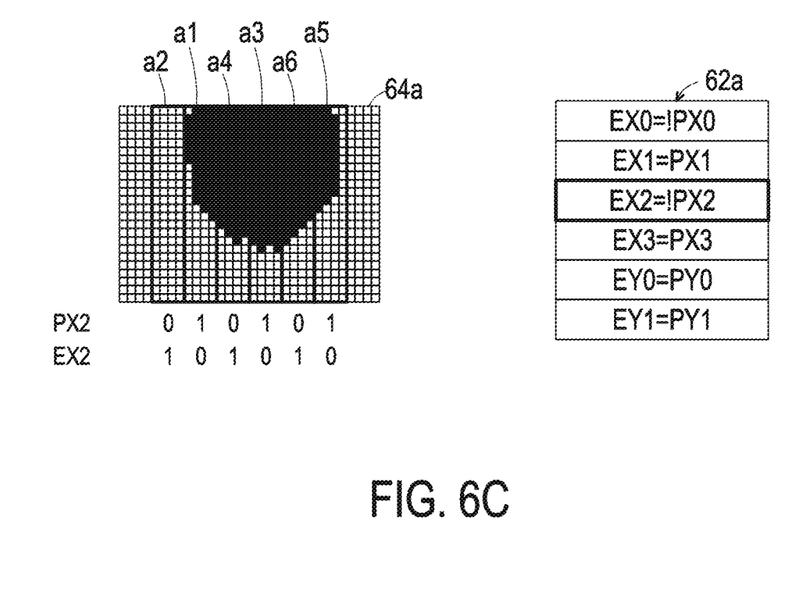
Figure 6D:
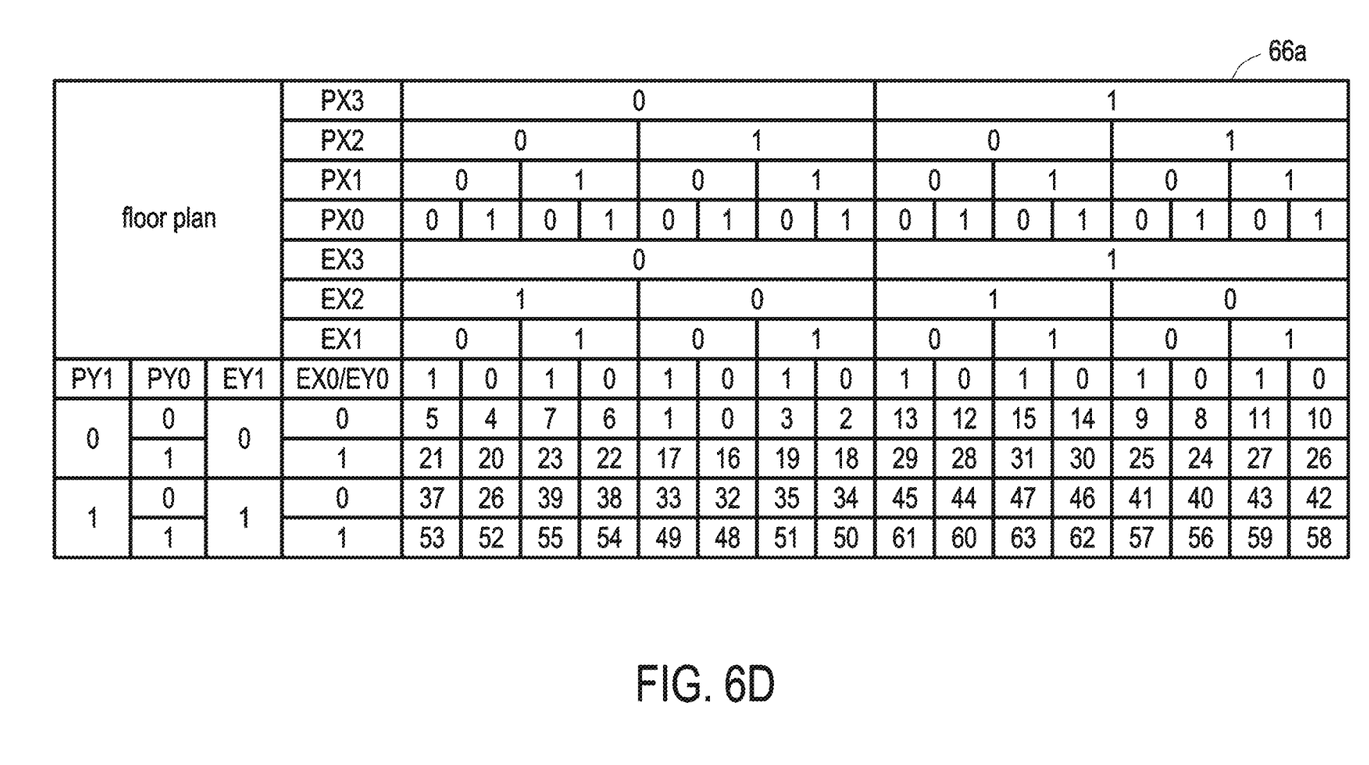

For instance, FIG. 6C illustrates corrected scramble equations 62a and a test graph 64a obtained by using the corrected scramble equations 62a to convert raw data to physical addresses. FIG. 6D illustrates a conversion table 66a showing conversion between electrical addresses and physical addresses corresponding to the corrected scramble equations 62a. As indicated by the test graph 64a, by correcting the scramble equations corresponding to the portions a1-a6 of the test graph 64 and using the corrected scramble equations 62a for scramble conversion (including inversion scramble conversion for EX2), the verification pattern in the resulted test graph 64a matches the originally determined verification pattern. Therefore, it is confirmed that the scramble equation EX2=PX2 should be replaced by EX2=!PX2.

Figure 7:
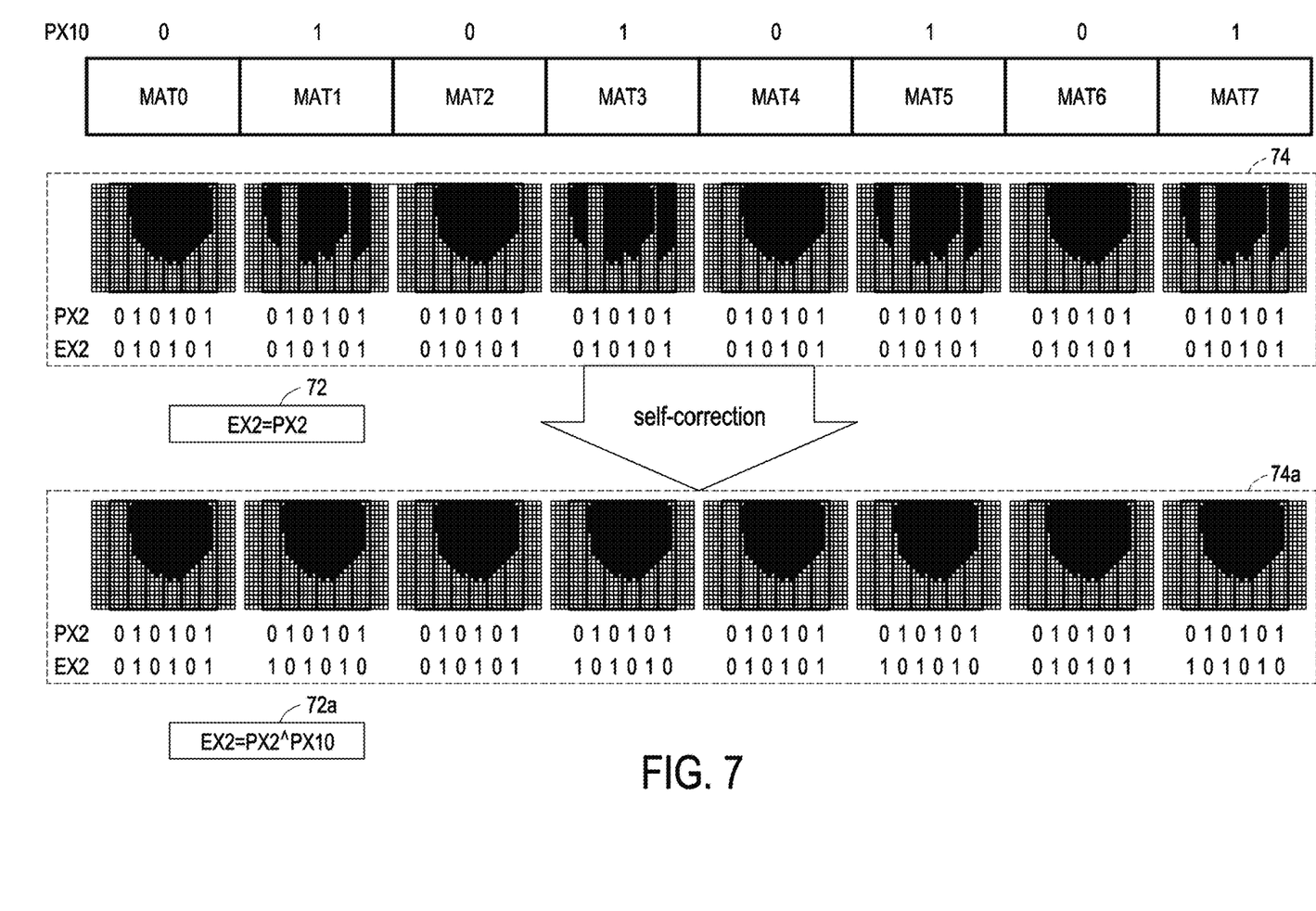
FIG. 7 illustrates an example of correcting a scramble equation, according to some embodiments of the present disclosure.

FIG. 7 illustrates an example of correcting a scramble equation, according to some embodiments of the present disclosure. The correction of scramble equation targets 8 tiles MAT0-MAT7 in an integrated circuit. Test graphs 74 of the tiles MAT0-MAT7 are obtained by performing scramble conversion using a pre-determined scramble equation 72 (e.g., EX2=PX2). Boundary and position of portions of verification patterns in the test graphs 74 are compared with boundary and position of corresponding portions of an originally determined verification pattern. According to comparison result, even ones of the tiles (i.e., tiles MAT1, MAT3, MAT5 and MAT7) are required to be corrected. An inversion scramble equation should be used for obtaining a corrected test graph 74a having verification patterns (corresponding to the tiles MAT1, MAT3, MAT5 and MAT7) consistent with the originally determined verification pattern. Furthermore, by considering both of the comparison result and a bit PX10 indicating a sequential order of the tiles MAT0-MAT7, the pre-determined scramble equation 72 is determined to be replaced by a scramble equation 72a EX2=PX2^PX10.

As above, the integrated testing method and the integrated circuit testing apparatus according to embodiments of the present disclosure identify incorrect scramble equations by pattern recognition, and perform self-correction. As compared to operating manually, the method and apparatus according to embodiments of the present disclosure can spot the incorrect scramble equations with greater accuracy, and can avoid human errors on finding correct scramble equations. By uploading the corrected scramble equations to a view system, the view system can transform raw data to a test graph by using the uploaded scramble equations, thus the test graph can be examined on the view system and can be ensured to be correct. Therefore, verification process for new product can be shortened, and cost for developing new product can be lowered.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A testing method for an integrated circuit, suitable for an electronic apparatus having a processor, and comprising:
   operating a tester to perform a qualitative testing on devices in the integrated circuit by following electrical addresses of the devices, and to introduce an original verification pattern during the qualitative testing, such that a verification pattern corresponding to the original verification pattern can be converted from a raw data of a result of the qualitative testing;

converting the raw data to a test graph presented by physical addresses, by using pre-determined scramble equations; and identifying portions of the verification pattern appeared in the test graph and comparing the portions of the verification pattern with corresponding portions of the original verification pattern by pattern recognition, and correcting the pre-determined scramble equations according to comparison result.

2. The method according to claim 1, further comprising: determining the original verification pattern according to properties of tiles in the integrated circuit.

3. The method according to claim 2, wherein the step of identifying portions of the verification pattern appeared in the test graph and comparing the portions of the verification pattern with corresponding portions of the original verification pattern by pattern recognition, and correcting the scramble equations according to comparison result comprises:

using pattern recognition to identify portions of the verification pattern in the test graph within each tile and comparing the portions of the verification pattern with corresponding portions of the original verification pattern, and correcting a group of the scramble equations corresponding to each tile according to comparison result.

4. The method according to claim 3, wherein the step of using pattern recognition to identify portions of the verification pattern in the test graph within each tile and comparing the portions of the verification pattern with corresponding portions of the original verification pattern, and correcting a group of the scramble equations corresponding to each tile according to comparison result further comprises:

correcting another group of the scramble equations corresponding to between-tiles regions in the integrated circuit according to the corrected scramble equations corresponding to each tile.

5. The method according to claim 1, wherein the step of introducing an original verification pattern during the qualitative testing comprises:

determining all of the devices within the original verification pattern as failed to the qualitative testing.

6. The method according to claim 1, wherein the step of identifying portions of the verification pattern appeared in the test graph and comparing the portions of the verification pattern with corresponding portions of the original verification pattern by pattern recognition, and correcting the scramble equations according to comparison result comprises:

using pattern recognition to identify boundary and position of each of the portions of the verification pattern, and comparing the boundary and the position of the portions of the verification pattern with boundary and position of corresponding portions of the original verification pattern, to determine a group of the scramble equations required to be corrected; and sequentially correcting the scramble equations in the group, and performing scramble conversion on the raw data by using updated scramble equations, then determining the updated scramble equations are finalized when the verification pattern in the test graph matches the original verification pattern.

7. The method according to claim 6, wherein the step of sequentially correcting the scramble equations in the group, and performing scramble conversion on the raw data by using updated scramble equations comprises:

correcting the scramble equations in the group by following an order from a most significant bit to a least significant bit, and performing scramble conversion by using updated scramble equations.

8. The method according to claim 7, after the step of sequentially correcting the scramble equations in the group, and performing scramble conversion on the raw data by using updated scramble equations, further comprising:

when the verification pattern in the test graph resulted from the scramble conversion does not match the original verification pattern, selecting one of the scramble equations in the group for correction; and sequentially correcting other scramble equations in the group, and determining the updated scramble equations are finalized when the verification pattern in the test graph matches the original verification pattern.

9. The method according to claim 1, wherein the original verification pattern comprises a circular pattern or an asymmetric pattern.

10. A testing apparatus for an integrated circuit, comprising:

connecting apparatus, connected to a tester for testing the integrated circuit;

a storage apparatus, configured to store application programs and scramble equations; and a processor, coupled to the connecting apparatus and the storage apparatus, and configured to load and execute the application programs, to:

use the tester to perform a qualitative testing on devices in the integrated circuit by following electrical addresses of the devices, and to introduce an original verification pattern in the qualitative testing, such that a verification pattern corresponding to the original verification pattern can be converted from a raw data of a result of the qualitative testing;

convert the raw data to a test graph presented by physical addresses, by using pre-determined scramble equations; and identify portions of the verification pattern appeared in the test graph and compare the portions of the verification pattern with corresponding portions of the original verification pattern by pattern recognition, and correct the pre-determined scramble equations according to comparison result.

11. The testing apparatus for the integrated circuit according to claim 10, wherein the processor is further configured to determine the original verification pattern according to properties of tiles in the integrated circuit.

12. The testing apparatus for the integrated circuit according to claim 11, wherein the processor is configured to use pattern recognition to identify portions of the verification pattern in the test graph within each tile and compare the portions of the verification pattern with corresponding portions of the original verification pattern, and correct a group of the scramble equations corresponding to each tile according to comparison result.

13. The testing apparatus for the integrated circuit according to claim 12, wherein the processor is further configured to correct another group of the scramble equations corresponding to between-tiles regions in the integrated circuit according to the corrected scramble equations corresponding to each tile.

14. The testing apparatus for the integrated circuit according to claim 10, wherein the processor is configured to determine all of the devices within the original verification pattern as failed to the qualitative testing.

15. The testing apparatus for the integrated circuit according to claim 10, wherein the processor is configured to:
   use pattern recognition to identify boundary and position of each of the portions of the verification pattern, and compare the boundary and the position of the portions of the verification pattern with boundary and position of corresponding portions of the original verification pattern, to determine a group of the scramble equations required to be corrected; and
   sequentially correct the scramble equations in the group, and perform scramble conversion on the raw data by using updated scramble equations, and determine the updated scramble equations are finalized when the verification pattern in the test graph matches the original verification pattern.

16. The testing apparatus for the integrated circuit according to claim 15, wherein the processor is configured to correct the scramble equations in the group by following an order from a most significant bit to a least significant bit, and perform scramble conversion by using updated scramble equations.

17. The testing apparatus for the integrated circuit according to claim 16, wherein the processor is further configured to:
   select one of the scramble equations in the group for correction when the verification pattern in the test graph resulted from the scramble conversion does not match the original verification pattern; and
   sequentially correct other scramble equations in the group, and determine the updated scramble equations are finalized when the verification pattern in the test graph matches the original verification pattern.

18. The testing apparatus for the integrated circuit according to claim 10, wherein the original verification pattern comprises a circular pattern or an asymmetric pattern.

* * * * *